(12) United States Patent
Bojarczuk, Jr. et al.

(10) Patent No.: US 7,446,380 B2
(45) Date of Patent: Nov. 4, 2008

(54) STABILIZATION OF FLATBAND VOLTAGES AND THRESHOLD VOLTAGES IN HAFNIUM OXIDE BASED SILICON TRANSISTORS FOR CMOS

(75) Inventors: Nestor A. Bojarczuk, Jr., Poughkeepsie, NY (US); Michael P. Chudzik, Danbury, CT (US); Matthew W. Copel, Yorktown Heights, NY (US); Supratik Guha, Chappaqua, NY (US); Rajarao Jammy, Hopewell Junction, NY (US); Vijay Narayanan, New York, NY (US); Vamsi K. Paruchuri, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 286 days.

(21) Appl. No.: 11/118,521

(22) Filed: Apr. 29, 2005

(65) Prior Publication Data

US 2006/0244035 A1 Nov. 2, 2006

(51) Int. Cl.
*H01L 29/78* (2006.01)
(52) U.S. Cl. ............... 257/411; 257/412; 257/E29.132
(58) Field of Classification Search ............... 257/411, 257/E29.001, E29.132
See application file for complete search history.

(56) References Cited

U.S. PATENT DOCUMENTS

| 6,320,213 | B1 * | 11/2001 | Kirlin et al. ............... 257/295 |
|---|---|---|---|
| 6,531,354 | B2 | 3/2003 | Maria et al. |
| 6,753,567 | B2 | 6/2004 | Maria et al. |
| 6,790,791 | B2 | 9/2004 | Ahn et al. |
| 6,844,203 | B2 | 1/2005 | Ahn et al. |
| 7,199,015 | B2 * | 4/2007 | Atanackovic ............... 438/311 |
| 7,221,018 | B2 * | 5/2007 | Forbes ......................... 257/324 |
| 7,364,974 | B2 * | 4/2008 | Atanackovic ............... 438/289 |
| 2004/0104439 | A1 * | 6/2004 | Haukka et al. ............... 257/368 |
| 2004/0222474 | A1 | 11/2004 | Chau et al. |
| 2005/0009370 | A1 | 1/2005 | Ahn et al. |
| 2005/0064690 | A1 * | 3/2005 | Amos et al. .................. 438/592 |

* cited by examiner

*Primary Examiner*—Lex Malsawma
(74) *Attorney, Agent, or Firm*—Scully, Scott, Murphy & Pressner, P.C.; Ido Tuchman, Esq.

(57) ABSTRACT

The present invention provides a metal stack structure that stabilizes the flatband voltage and threshold voltages of material stacks that include a Si-containing conductor and a Hf-based dielectric. This present invention stabilizes the flatband voltages and the threshold voltages by introducing a rare earth metal-containing layer into the material stack that introduces, via electronegativity differences, a shift in the threshold voltage to the desired voltage. Specifically, the present invention provides a metal stack comprising a hafnium-based dielectric; a rare earth metal-containing layer located atop of, or within, said hafnium-based dielectric; an electrically conductive capping layer located above said hafnium-based dielectric; and a Si-containing conductor.

15 Claims, 6 Drawing Sheets

STABILIZATION OF FLATBAND VOLTAGES AND THRESHOLD VOLTAGES IN HAFNIUM OXIDE BASED SILICON TRANSISTORS FOR CMOS

FIELD OF THE INVENTION

The present invention generally relates to a semiconductor structure, and more particularly to a material stack useful in metal oxide semiconductor capacitors (MOSCAPs) and metal oxide semiconductor field effect transistors (MOSFETs) that includes a rare earth metal (or rare earth-like)-containing layer present on top of, or within, a dielectric layer which is capable of stabilizing the threshold voltage and flatband voltage of a Si-containing conductor. Specifically, the presence of the rare earth metal (or rare earth-like)-containing layer induces a band bending in a semiconductor substrate so as to shift the threshold voltage to more negative values than when such a layer is not used.

BACKGROUND OF THE INVENTION

In standard silicon complementary metal oxide semiconductor (CMOS) technology, n-type field effect transistors (pFET) use an As (or other donor) doped n-type polysilicon layer as a gate electrode that is deposited on top of a silicon dioxide or silicon oxynitride gate dielectric layer. The gate voltage is applied through this polysilicon layer to create an inversion channel in the p-type silicon underneath the gate oxide layer.

In future technology, silicon dioxide or silicon oxynitride dielectrics will be replaced with a gate material that has a higher dielectric constant. These materials are known as "high k" materials with the term "high k" denoting an insulating material whose dielectric constant is greater than 4.0, preferably greater than about 7.0. The dielectric constants mentioned herein are relative to a vacuum unless otherwise specified. Of the various possibilities, hafnium oxide, hafnium silicate, or hafnium silicon oxynitride may be the most suitable replacement candidates for conventional gate dielectrics due to their excellent thermal stability at high temperatures.

Silicon metal oxide semiconductor field effect transistors (MOSFETs) fabricated with a hafnium-based dielectric as the gate dielectric suffer from a non-ideal threshold voltage when n-MOSFETs are fabricated. This is a general problem, and in particular, when the MOSFET consists of $HfO_2$ as the dielectric and TiN/polySi as the gate stack, the threshold voltage is in the 0.05 to 0.3 V range typically after standard thermal treatments. Ideally, the threshold voltage should be around −0.2 to −0.05 V or so. To date, there is no known viable solution that can be used to solve the aforementioned problem that exists with Si MOSFETs that include a Hf-based dielectric.

In view of the above-mentioned problem with prior art Si MOSFETs that include a Hf-based dielectric, there is a need for providing a method and structure that is capable of stabilizing the flatband voltages and threshold voltages in MOSFETs that contain a Hf-based gate dielectric.

SUMMARY OF THE INVENTION

The present invention provides a metal stack structure that stabilizes the flatband voltages and threshold voltages of material stacks that include a Si-containing conductor and a Hf-based dielectric. It is emphasized that prior art Si MOSFETs fabricated with hafnium oxide as the gate dielectric suffers from a non-ideal threshold voltage when n-MOSFETs are fabricated. When the stacks consists of $HfO_2$ as the dielectric, and TiN/polysilicon as the gate stack component, the threshold voltage is in the 0.05 to 0.3 V range after standard treatments. Ideally, the threshold voltage should be around −0.2 to −0.05 V or so. This present invention solves this problem by introducing a rare earth metal-containing layer into the material stack that introduces, via electronegativity differences, a shift in the threshold voltage to the desired voltage.

In broad terms, the present invention provides a material stack comprising:

a hafnium-based dielectric;

a rare earth metal-containing layer located atop of, or within, said hafnium-based dielectric;

an electrically conducting capping layer located above said hafnium-based dielectric; and a Si-containing conductor.

In some embodiments of the present invention, an optional chemox layer can be located beneath the Hf-based dielectric. As used throughout the instant application, the term "chemox layer" denotes an optional interfacial dielectric that is formed on the surface of a semiconductor substrate prior to forming the Hf-based dielectric. It is noted that the term "rare earth metal-containing layer" is used herein to denote rare earth materials as well as materials that behave as a rare earth material.

In yet another embodiment of the present invention, a material stack including an optional chemox layer, $HfO_2$ or Hf silicate as said Hf-based dielectric, a metal nitride layer including at least one rare earth metal or rare earth-like material, and polySi as the Si-containing gate conductor, wherein said metal nitride layer is used as both said rare earth-containing layer and said electrically conducting capping layer is provided.

It is noted that the presence of the rare earth metal-containing layer in the inventive material stack introduces a charge center into the Hf-based dielectric which has an electronegativity and/or valence that is different from the Hf-based dielectric layer. Specifically, the presence of the rare earth metal-containing layer in the inventive material stack introduces foreign atoms into the Hf-based dielectric that may residue either at substitutional or interstitital sites on the Hf-based dielectric. By altering the defect chemistry, the charge centers alter the electrostatic profile in the material stack, and the effective alignments of the potential in the dielectric and the vicinity of the interfaces between the Hf-based dielectric and the silicon and electrode sandwiching the dielectric. It is noted that the rare earth metal-containing layer may remain as a separate layer or it may interdiffuse within the Hf-based dielectric. The location of the rare earth metal-containing layer within the Hf-based dielectric is not critical so long as there is a concentration gradient of the rare earth metal-containing layer present in, or on, the Hf-based dielectric. The concentration gradient may be abrupt or non-abrupt.

In addition to the material stack described above, the present invention also provides MOSCAP and MOSFET structures which include the inventive material stack as a component. Specifically, and in broad terms, the present invention provides a semiconductor structure that comprises:

a patterned material stack located on a surface of a semiconductor substrate, said patterned material stack comprising a hafnium-based dielectric; a rare earth metal-containing layer located atop of, or within, said hafnium-based dielectric; an electrically conductive capping layer located above said hafnium-based dielectric; and a Si-containing conductor.

The present invention also relates to a method of fabricating the inventive material stack as well as methods of fabricating a semiconductor structure that includes the same.

It is observed that the inventive material stack provides a negative shift in the flatband voltage (as compared to a standard material stack that does not include the rare earth metal-containing layer) such that the flatband voltage is now appropriate for the fabrication of an nMOSFET. In an ideal n-channel MOSFET, the electrode is such that its Fermi level is aligned with the conduction band of the Si substrate. In the past, the problem has been that a practical nMOSFET could not be built with such an alignment and consequently the flatband voltage was greater than +0.1 V instead of −0.2 V, which is typical of such flatband voltages for Si substrates with standard doping. Using the above described material stack, the flatband voltage is about −0.15 V to about 4.05 V. Such a flatband voltage translates to a threshold voltage (the voltage at which the transistor turns on) to about 0.1 V for an n-channel MOSFET, which is the desired value. The prior material stack not including the rare earth metal-containing layer results in high electron channel mobilities (on the order of about 200 $cm^2/Vs$ at an electric field of 1 MV/cm) at low inversion electrical thickness (on the order of about 14-15 Å). However, the prior art material stack does not deliver the necessary threshold voltages for nMOSFETs. The desired threshold voltage, without compromising the other specifications, is achieved using the inventive material stack.

There are several unique aspects of the inventive material stack that should be briefly discussed. First, the presence of the rare earth metal-containing layer introduces a dipole into the dielectric stack. The origin of the dipole is due to the strongly electropositive nature of the rare earth metal atom. The sheet of rare earth metal atoms draws a positive charge towards it, resulting in a dipole. Without wishing to be bound by any theory, it is believed that this dipole creates the desired shift in flatband voltage and threshold voltage. Thermal processes diffuse the rare earth metal atoms across the gate stack. However, such a dipole will result as long as there is a non-symmetrical distribution in the rare earth metal composition across the stack, regardless of whether the rare earth metal composition in the stack is atomically abrupt or diffused. Second, the presence of the rare earth metal atoms in the Hf-based dielectric (due to interdiffusion) will result in a charge compensated dielectric. It is known that positively charged oxygen vacancies play a role in flatband voltage determination in an ionic oxide such as hafnium oxide.

If a small quantity of rare earth metal is present, the rare earth metal ion substituting for Hf ion acts as a negatively charged defect ($RE_{Hf}$). Due to needs for charge neutrality, the presence of the rare earth metal substitutional defect can raise the concentration of the charged oxygen vacancies, thereby promoting the necessary flatband voltage shift. Thirdly, via its strong electropositive nature, the rare earth metal atom will modify the interface chemistry at the semiconductor/chemox/Hf-based dielectric interfacial region and the top Hf-based dielectric/rare earth metal-containing/electrically conductive capping layer region altering the effective alignment of the workfunctions of the material stack. In essence, all three of the aforementioned phenomena are the consequence of insertion of a highly electropositive element as a distinct layer in the stack sequence. This distinct layer then can interdiffuse, but the presence of a composition profile for this electropositive element ensures the flatband/threshold voltage.

DETAILED DESCRIPTION OF THE INVENTION

The present invention, which provides a material stack useful in MOSCAPs and MOSFETs that includes a rare earth metal-containing layer present on top of, or in, a dielectric layer which is capable of stabilizing the threshold voltage and flatband voltage of a Si-containing conductor, will now be described in greater detail by referring to the following discussion and drawings that accompany the present application. It is noted that the drawings of the present application are provided for illustrative purposes and thus they are not drawn to scale.

It is again emphasized that prior art Si MOSFETs fabricated with hafnium oxide as the gate dielectric suffer from a non-ideal threshold voltage when n-MOSFETs are fabricated. When the stacks consists of $HfO_2$ as the dielectric, and TiN/polysilicon as the gate stack component, the threshold voltage is in the 0.05 to 0.3 V range after standard treatments. Ideally, the threshold voltage should be around −0.2 to −0.05 V or so. This present invention solves this problem by introducing a rare earth metal-containing layer into the material stack that introduces, via electronegativity differences, a shift in the threshold voltage to the desired voltage. Although Hf-based dielectrics are specifically described and illustrated, the present invention can also be used when the Hf-based dielectric is replaced, or used in conjunction, with another dielectric material having a dielectric constant of greater than about 4.0.

The material stack of the present invention together with the processing steps that are used in forming the same will be described first followed by a description of the same as a component of a MOSCAP and a MOSFET. It is noted that although the MOSCAP and the MOSFET are shown as separate structures, the present invention also contemplates structures which include both the MOSCAP and the MOSFET on a surface of a single semiconductor substrate.

Figure 1A:
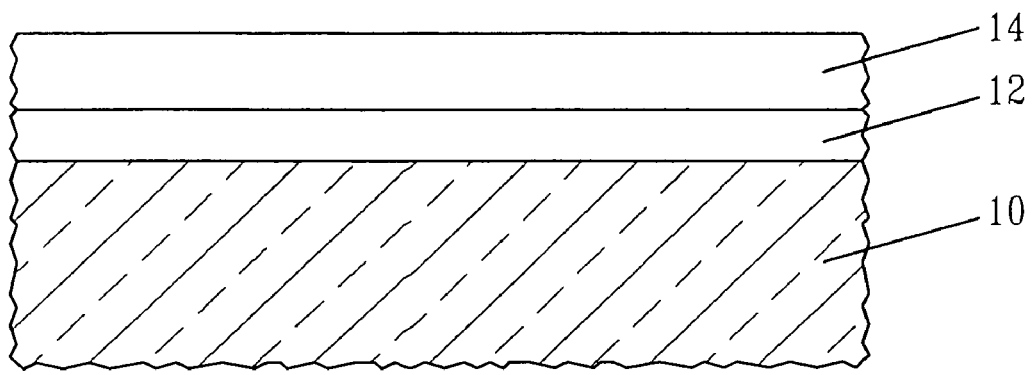
FIGS. 1A-1D are pictorial representations (through cross sectional views) illustrating the basic processing steps that are employed in the present invention for forming a material stack of the present invention.

Reference is first made to FIGS. 1A-1D which are pictorial representations (through cross sectional views) depicting the basic processing steps that are used in forming the inventive material stack on the surface of a semiconductor substrate. FIG. 1A shows an initial structure that is formed in the present invention that includes a semiconductor substrate 10, an optional chemox layer 12 on a surface of the semiconductor substrate 10 and a Hf-based dielectric 14 that is located on the optional chemox layer 12. When the chemox layer 12 is not present, the Hf-based dielectric 14 is located on a surface of the semiconductor substrate 10.

The semiconductor substrate 10 of the structure shown in FIG. 1A comprises any semiconducting material including, but not limited to: Si, Ge, SiGe, SiC, SiGeC, Ge, GaAs, GaN, InAs, InP and all other III/V or II/VI compound semiconductors. Semiconductor substrate 10 may also comprise an organic semiconductor or a layered semiconductor such as Si/SiGe, a silicon-on-insulator (SOI), a SiGe-on-insulator (SGOI) or germanium-on-insulator (GOI). In some embodiments of the present invention, it is preferred that the semiconductor substrate 10 be composed of a Si-containing semiconductor material, i.e., a semiconductor material that includes silicon. The semiconductor substrate 10 may be doped, undoped or contain doped and undoped regions therein. The semiconductor substrate 10 may include a single crystal orientation or it may include at least two coplanar surface regions that have different crystal orientations (the latter substrate is referred to in the art as a hybrid substrate). When a hybrid substrate is employed, the NFET is typically formed on a (100) crystal surface, while the pFET is typically formed on a (110) crystal plane. The hybrid substrate can be formed by techniques that are well known in the art.

The semiconductor substrate 10 may also include a first doped (n- or p-) region, and a second doped (n- or p-) region. For clarity, the doped regions are not specifically shown in the drawing of the present application. The first doped region and the second doped region may be the same, or they may have different conductivities and/or doping concentrations. These doped regions are known as "wells" and they are formed utilizing conventional ion implantation processes.

At least one isolation region (not shown) is then typically formed into the semiconductor substrate 10. The isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities, i.e., nFETs and pFETs. The neighboring gate regions can have the same conductivity (i.e., both n- or p-type), or alternatively they can have different conductivities (i.e., one n-type and the other p-type).

After processing the semiconductor substrate 10, a chemox layer 12 is optionally formed on the surface of the semiconductor substrate 10. The optional chemox layer 12 is formed utilizing a conventional growing technique that is well known to those skilled in the art including, for example, oxidation or oxynitridation. The chemox layer 12 is comprised of silicon oxide, silicon oxynitride, a nitrided silicon oxide as well as other (e.g., non-Si) semiconductor oxides, oxynitrides and nitrided oxides. The thickness of the chemox layer 12 is typically from about 0.5 to about 1.2 nm, with a thickness from about 0.8 to about 1 nm being more typical.

In accordance with an embodiment of the present invention, the chemox layer 12 is a silicon oxide layer having a thickness from about 0.6 to about 0.8 nm that is formed by wet chemical oxidation. The process step for this wet chemical oxidation includes treating a cleaned semiconductor surface (such as a HF-last semiconductor surface) with a mixture of ammonium hydroxide, hydrogen peroxide and water (in a 1:1:5 ratio) at 65° C.

Next, a Hf-based dielectric 14 can be formed on the surface of the chemox layer 12, if present, or the surface of the semiconductor substrate 10 by a deposition process such as, for example, chemical vapor deposition (CVD), plasma-assisted CVD, physical vapor deposition (PVP), metalorganic chemical vapor deposition (MOCVD), atomic layer deposition (ALD), evaporation, reactive sputtering, chemical solution deposition and other like deposition processes. The Hf-based dielectric 14 may also be formed utilizing any combination of the above processes.

The Hf-based dielectric 14 is comprised of hafnium oxide ($HfO_2$), hafnium silicate ($HfSiO_x$), Hf silicon oxynitride (HfSiON) or multilayers thereof. In some embodiments, the Hf-based dielectric 14 comprises a mixture of $HfO_2$ and $ZrO_2$. In other embodiments, the Hf-based dielectric 14 can be replaced, or used in conjunction with, another dielectric material having a dielectric constant of greater than about 4.0, typically greater than about 7.0. The other dielectrics are metal oxides or mixed metal oxides that are well known to those skilled in the art and they can be formed utilizing any of the techniques described herein in forming the Hf-based dielectric 14. Typically, the Hf-based dielectric 14 is hafnium oxide or hafnium silicate. The Hf-based dielectric 14 is a "high k" material whose dielectric constant is greater than about 10.0.

The physical thickness of the Hf-based dielectric 14 may vary, but typically, the Hf-based dielectric 14 has a thickness from about 0.5 to about 10 nm, with a thickness from about 0.5 to about 3 nm being more typical.

In one embodiment of the present invention, the Hf-based dielectric 14 is hafnium oxide that is formed by MOCVD were a flow rate of about 70 to about 90 mgm of hafnium-tetrabutoxide (a Hf-precursor) and a flow rate of $O_2$ of about 250 to about 350 sccm are used. The deposition of Hf oxide occurs using a chamber pressure between 0.3 and 0.5 Torr and a substrate temperature of between 400° and 500° C.

In another embodiment of the present invention, the Hf-based dielectric 14 is hafnium silicate which is formed by MOCVD using the following conditions (i) a flow rate of the precursor Hf-tetrabutoxide of between 70 and 90 mg/m, a flow rate of $O_2$ between 25 and 100 sccm, and a flow rate of $SiH_4$ of between 20 and 60 sccm; (ii) a chamber pressure between 0.3 and 0.5 Torr, and (iii) a substrate temperature between 400° and 500° C.

Figure 1B:
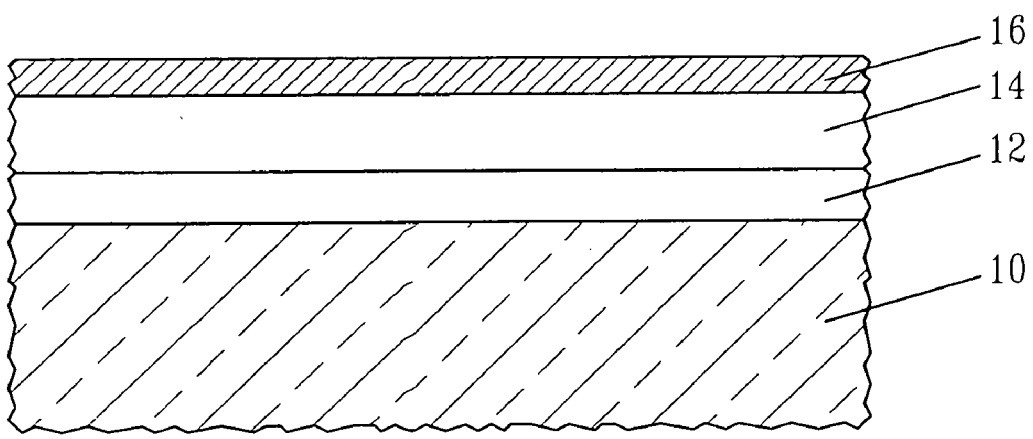

Once the structure shown in FIG. 1A is formed (with or without the optional chemox layer 12), a rare earth metal-containing layer 16 is then formed on the Hf-based dielectric 14 providing the structure shown in FIG. 1B. The rare earth metal-containing layer 16 comprises an oxide or nitride of at least one element from Group IIIB of the Periodic Table of Elements including, for example, La, Ce, Pr, Nd, Pm, Sm, Eu, Ga, Tb, Dy, Ho, Er, Tm, Yb, Lu or mixtures thereof. Preferably, the rare earth metal-containing layer 16 comprises an oxide of La, Ce, Y, Sm, Er, and/or Tb, with $La_2O_3$ or LaN being most preferred.

The rare earth metal-containing layer 16 is formed utilizing a conventional deposition process including, for example, evaporation, molecular beam deposition, MOCVD, ALD, PVP and other like deposition processes.

In one embodiment of the present invention, the rare earth metal-containing layer 16 is formed by placing the structure shown in FIG. 1A into the load-lock of a molecular beam deposition chamber, followed by pumping this chamber down to the range of $10^{-5}$ to $10^{-8}$ Torr. After these steps, the structure is inserted, without breaking vacuum into the growth chamber where the rare earth metal-containing layer 16 such as La oxide is deposited by directing atomic/molecular beams of the rare earth metal and oxygen or nitrogen onto the structure's surface. Specifically, because of the low pressure of the chamber, the released atomic/molecular species are beamlike and are not scattered prior to arriving at the structure. A substrate temperature of about 300° C. is used. In the case of $La_2O_3$ deposition, the La evaporation cell is held in the temperature range of 1400° to 1700° C., and a flow rate of 1 to 3 sccm of molecular oxygen is used. Alternatively, atomic or excited oxygen may be used as well, and this can be created by passing the oxygen through a radio frequency source excited in the range of 50 to 600 Watts. During the deposition, the pressure within the chamber can be in the range from $1\times10^{-3}$ to $8\times10^{-5}$ Torr, and the La oxide growth rate can be in the range from 0.1 to 2 nm per minute, with a range from 0.5 to 1.5 nm being more typical.

The rare earth metal-containing layer 16 typically has a thickness from about 0.1 nm to about 3.0 nm, with a thickness from about 0.3 nm to about 1.6 nm being more typical.

Figure 1C:
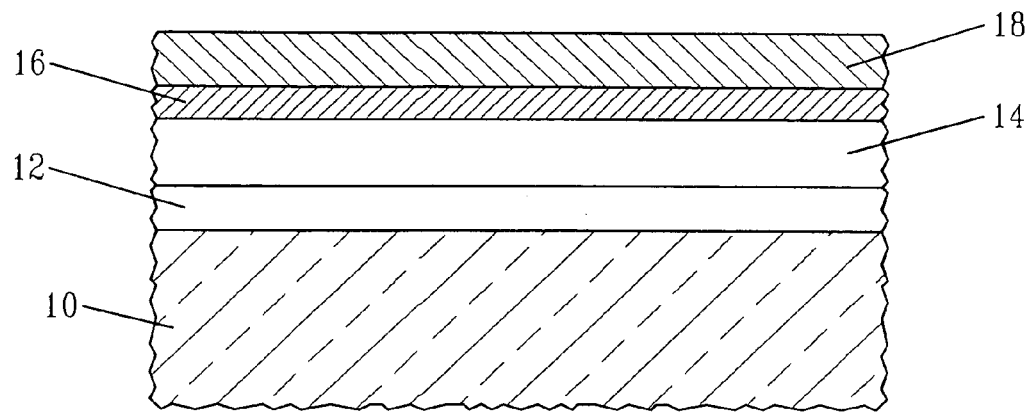

Next, and as shown in FIG. 1C, an electrically conducting capping layer 18 is formed on the surface of the rare earth metal-containing layer 16 utilizing a conventional deposition process. Examples of conventional depositions that can be used in forming the electrically conductive capping layer 18 include CVD, PVD, ALD, sputtering or evaporation. The electrically conductive capping layer 18 is formed on the surface of the rare earth metal-containing layer 16 utilizing a conventional deposition process in which the vacuum between depositions may or may not be broken. The electrically conductive capping layer 18 comprises a metallic material and/or a semimetallic material that is capable of conducting electrons. Specifically, the capping layer 18 is a metallic capping layer such as a metal nitride or a metal silicon nitride. The electrically conductive capping layer 18 provides the functions of (a) protecting the rare earth metal-containing layer from the ambient, (b) acts a diffusion barrier to ambient oxygen, and (c) prevents reaction of the rare earth metal-containing layer with the Si-containing conductor. In the embodiment when the capping layer includes a metal, the metal component of the capping layer 18 may comprise a metal from Group IVB or VB of the Periodic Table of Elements. Hence, the electrically conductive capping layer 18 may include Ti, Zr, Hf, V, Nb or Ta, with Ti or Ta being highly preferred. By way of example, the electrically conductive capping layer 18 preferably comprises TiN or TaN. In addition to the aforementioned electrically conductive capping layer materials, the present invention also includes a ternary alloy of Ti—La—N, a ternary alloy of Ta—La—N or a stack of a ternary alloy of Ti—La—N or Ta—La—N that is mixed with $La_2O_3$ or another one of the above mentioned rare earth metal-containing materials. If the later is used, it may be possible to replace the separate rare earth metal-containing layer 16 and the electrically conductive capping layer, with a single layer including both components.

For example and in yet another embodiment of the present invention, a material stack including an optional chemox layer, $HfO_2$ or Hf silicate as said Hf-based dielectric, a metal nitride layer including at least one rare earth metal or rare earth-like material, and polySi as the Si-containing gate conductor, wherein said metal nitride layer is used as both said rare earth-containing layer and said electrically conducting capping layer is provided.

The physical thickness of the electrically conductive capping layer 18 may vary, but typically, the electrically conductive capping layer 18 has a thickness from about 0.5 to about 200 nm, with a thickness from about 5 to about 80 nm being more typical.

In one embodiment of the present invention, the electrically conductive capping layer 18 is TiN that is deposited by evaporating Ti from an effusion cell held in the range of 1550° to 1900° C., typically 1600° to 1750° C., and using an atomic/excited beam of nitrogen that is passed through a remote radio frequency source. The substrate temperature can be around 300° C. and the nitrogen flow rate can be between 0.5 sccm and 3.0 sccm. These ranges are exemplary and by no way limit the present invention. The nitrogen flow rate depends upon the specifics of the deposition chamber, in particularly, the pumping rate on the chamber. The TiN may be deposited, in other ways, as well, such as chemical vapor deposition or sputtering and the technique is not critical.

Figure 1D:
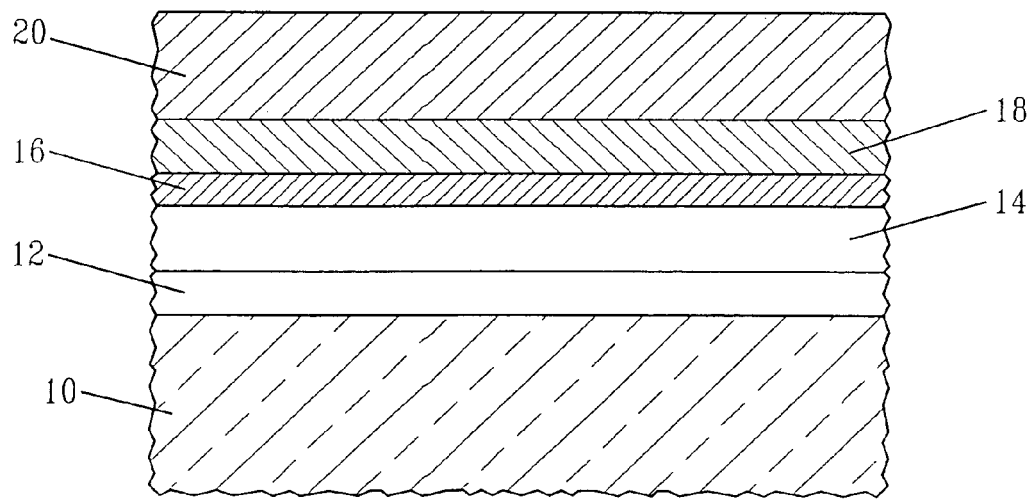

Following the formation of the electrically conductive capping layer 18 as shown in FIG. 1C, a Si-containing conductor 20 is formed atop the electrically conductive capping layer 18. The resultant structure including the Si-containing conductor 20 is shown in FIG. 1D. Specifically, a blanket layer of a Si-containing material is formed on the electrically conductive capping layer 18 utilizing a known deposition process such as, for example, physical vapor deposition, CVD or evaporation. The Si-containing material used in forming the conductor 20 includes Si or a SiGe alloy layer in either single crystal, polycrystalline or amorphous form. Combinations of the aforementioned Si-containing materials are also contemplated herein. The blanket layer of Si-containing material 20 may be doped or undoped. If doped, an in-situ doping deposition process may be employed in forming the same. Alternatively, a doped Si-containing layer can be formed by deposition, ion implantation and annealing. The ion implantation and annealing can occur prior to or after a subsequent etching step that patterns the material stack. The doping of the Si-containing layer will shift the workfunction of the gate conductor formed. Illustrative examples of dopant ions for nMOSFETs include elements from Group VA of the Periodic Table of Elements (Group IIIA elements can be used when pMOSFETs are formed). The thickness, i.e., height, of the Si-containing layer 20 deposited at this point of the present invention may vary depending on the deposition process employed. Typically, the Si-containing conductor 20 has a vertical thickness from about 20 to about 180 nm, with a thickness from about 40 to about 150 nm being more typical.

Figure 2A:
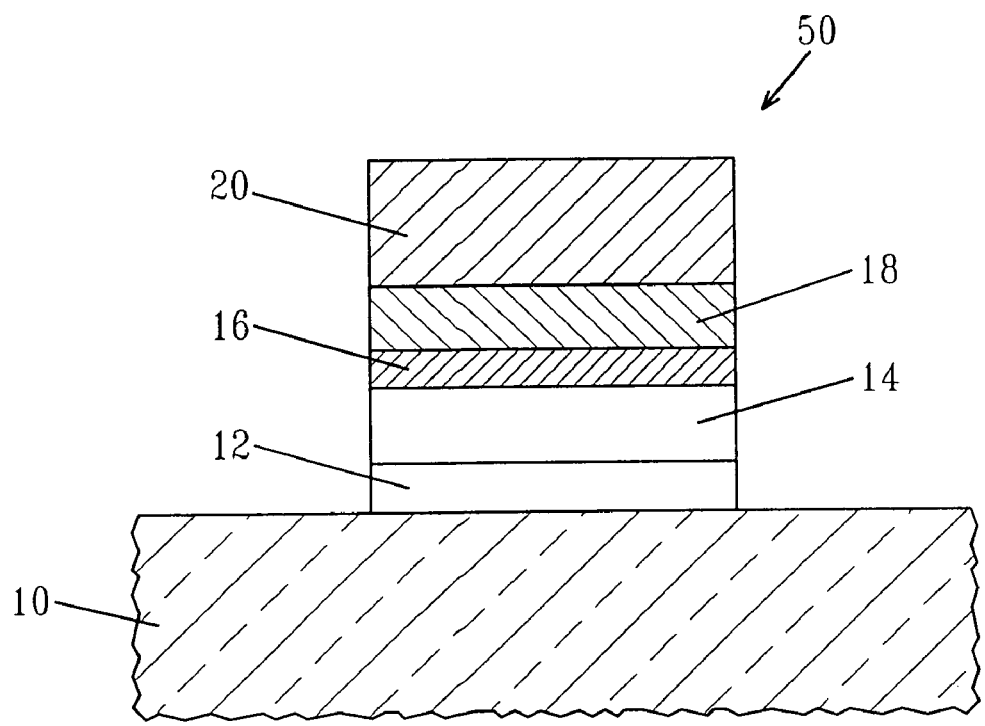
FIG. 2A is a pictorial representation (through a cross sectional view) illustrating a MOSCAP structure that can be formed from the inventive material stack.
Figure 2B:
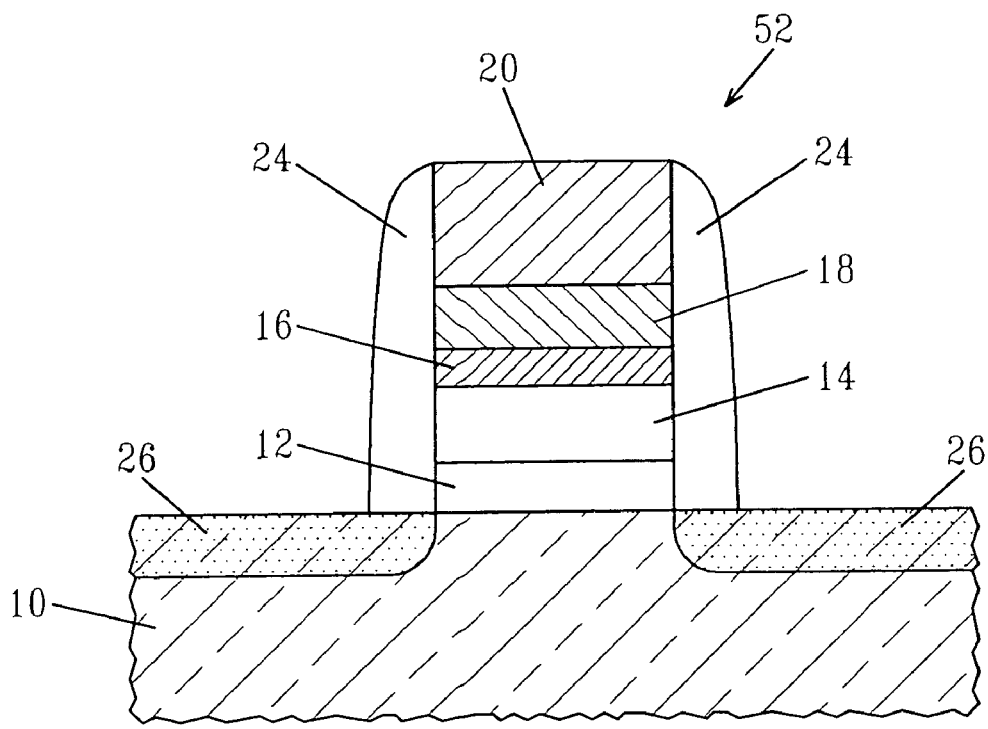
FIG. 2B is a pictorial representation (through a cross sectional view) illustrating a MOSFET structure that can be formed from the inventive material stack.

The gate stack structure shown in FIG. 1D can then be fabricated into a MOSCAP 50 as shown in FIG. 2A or a MOSFET 52 as shown in FIG. 2B utilizing conventional processes that are well known in the art. Each of the illustrated structures includes a material stack such as shown in FIG. 1D which has been at least patterned by lithography and etching.

The MOSCAP formation includes forming a thermal sacrificial oxide (not shown) on the surface of the semiconductor substrate. Using lithography, the active areas of the capacitor structure are opened in the field oxide by etching. Following the removal of the oxide, the material stack as shown in FIG. 1D is formed as described above. Specifically, the material stack was provided, patterned by lithography and etching, and then the dopants are introduced into the Si-containing conductor 20. The dopants are typically P (implant dose of 5E15 ions/$cm^2$ using an implant energy of 12 keV). The dopants are activated using an activation anneal that is performed at 950° C. to 1000° C. for about 5 seconds. In some cases, a forming gas anneal (5-10% hydrogen) can follow which is performed between 500° to 550° C. for chemox layer/semiconductor substrate interface state passivation.

The MOSFET formation includes first forming isolation regions within the substrate as described above. Similar to the MOSCAP and after removing the sacrificial oxide, a material stack as described above is formed. Following patterning of the material stack, at least one spacer 24 is typically, but not always, formed on exposed sidewalls of each patterned material stack. The at least one spacer 24 is comprised of an insulator such as an oxide, nitride, oxynitride and/or any combination thereof. The at least one spacer 24 is formed by deposition and etching.

The width of the at least one spacer 24 must be sufficiently wide such that the source and drain silicide contacts (to be subsequently formed) do not encroach underneath the edges of the patterned material stack. Typically, the source/drain silicide does not encroach underneath the edges of the patterned material stack when the at least one spacer 24 has a width, as measured at the bottom, from about 20 to about 80 nm.

The patterned material stack can also be passivated at this point of the present invention by subjecting the same to a thermal oxidation, nitridation or oxynitridation process. The passivation step forms a thin layer of passivating material about the material stack. This step may be used instead or in conjunction with the previous step of spacer formation. When used with the spacer formation step, spacer formation occurs after the material stack passivation process.

Source/drain diffusion regions 26 are then formed into the substrate. The source/drain diffusion regions 26 are formed utilizing ion implantation and an annealing step. The annealing step serves to activate the dopants that were implanted by the previous implant step. The conditions for the ion implantation and annealing are well known to those skilled in the art. The source/drain diffusion regions 26 may also include extension implant regions which are formed prior to source/drain implantation using a conventional extension implant. The extension implant may be followed by an activation anneal, or alternatively the dopants implanted during the extension implant and the source/drain implant can be activated using the same activation anneal cycle. Halo implants are also contemplated herein.

In some cases, a forming gas anneal (5-10% hydrogen) can follow which is performed between 500° to 550° C. for chemox layer/semiconductor substrate interface state passivation.

The above processing steps form the structure shown in FIG. 2B. Further CMOS processing such as formation of silicided contacts (source/drain and gate) as well as formation of BEOL (back-end-of-the-line) interconnect levels with metal interconnects can be formed utilizing processing steps that are well known to those skilled in the art The following example is provided for illustrative purposes and thus it should not be construed to limit the scope of the present application in any way.

EXAMPLE

In this example, an nMOSFET was prepared utilizing a material stack of the present invention and it was compared with a prior art nMOSFET which did not include the inventive material stack. Specifically, a material stack comprising $SiO_2/HfO_2/0.8$ nm $La_2O_3/30$ nm TiN/PolySi stack (Inventive) was prepared utilizing the processing steps mentioned above and that material stack was used as a component of an nMOSFET. A prior art material stack, not including La oxide was prepared and was used a component for a prior art nMOSFET (Prior Art). Each material stack after processing on a Si substrate was subjected to a 1000° C. rapid thermal anneal in nitrogen, followed by a 500° C. forming gas anneal.

Figure 3:
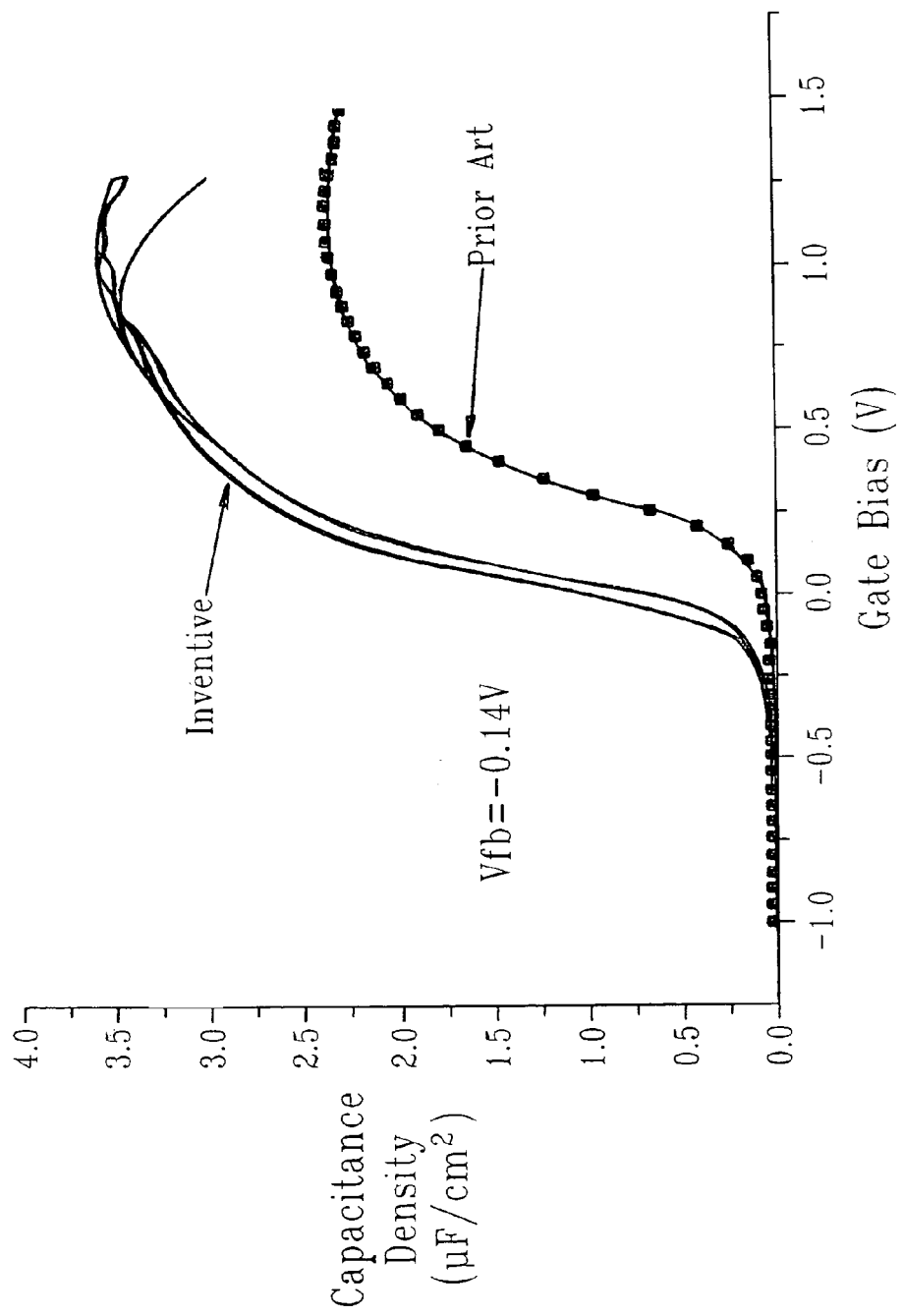
FIG. 3 is a graph including CV (capacitance vs. voltage) curves comparing $HfO_2/La_2O_3/TiN/PolySi$ stacks with typical $HfO_2/TiN/PolySi$ stacks after 1000° C. +500° C. forming gas anneal.

FIG. 3 shows the CV curves of the two nMOSFET. The CET (Capacitance Equivalent Thickness) and the EOT (Equivalent Oxide Thickness) of the Inventive material stack were 10.2 Å and 6.5 Å, respectively. The CET and the EOT of the Prior Art material stack were 14.7 Å and 10.5 Å, respectively.

The flatband voltage, which is characteristic of the threshold voltage, for the Inventive material stack is about 50-100 mV from ideal bandedge position for an n-doped polySi gate. For comparison, the Prior Art material stack, which does not include the rare earth metal-containing layer, was about 350 mV from ideal bandedge position. Another notable attribute was that extremely aggressive scaling obtained in the inventive devices (sub 1 nm EOTs) after high temperature annealing.

Figure 4:
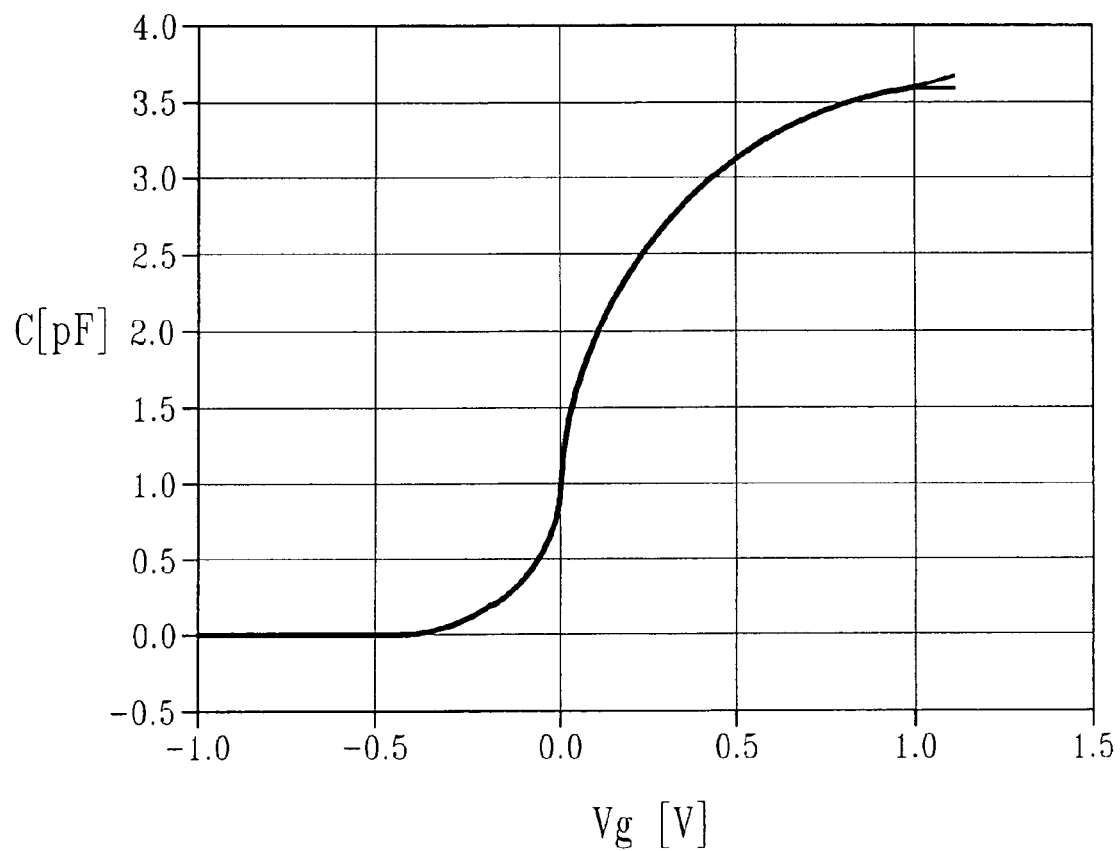
FIG. 4 is a graph plotting the CV of the inventive material stack as compared to ideal bandedge position.
Figure 5:
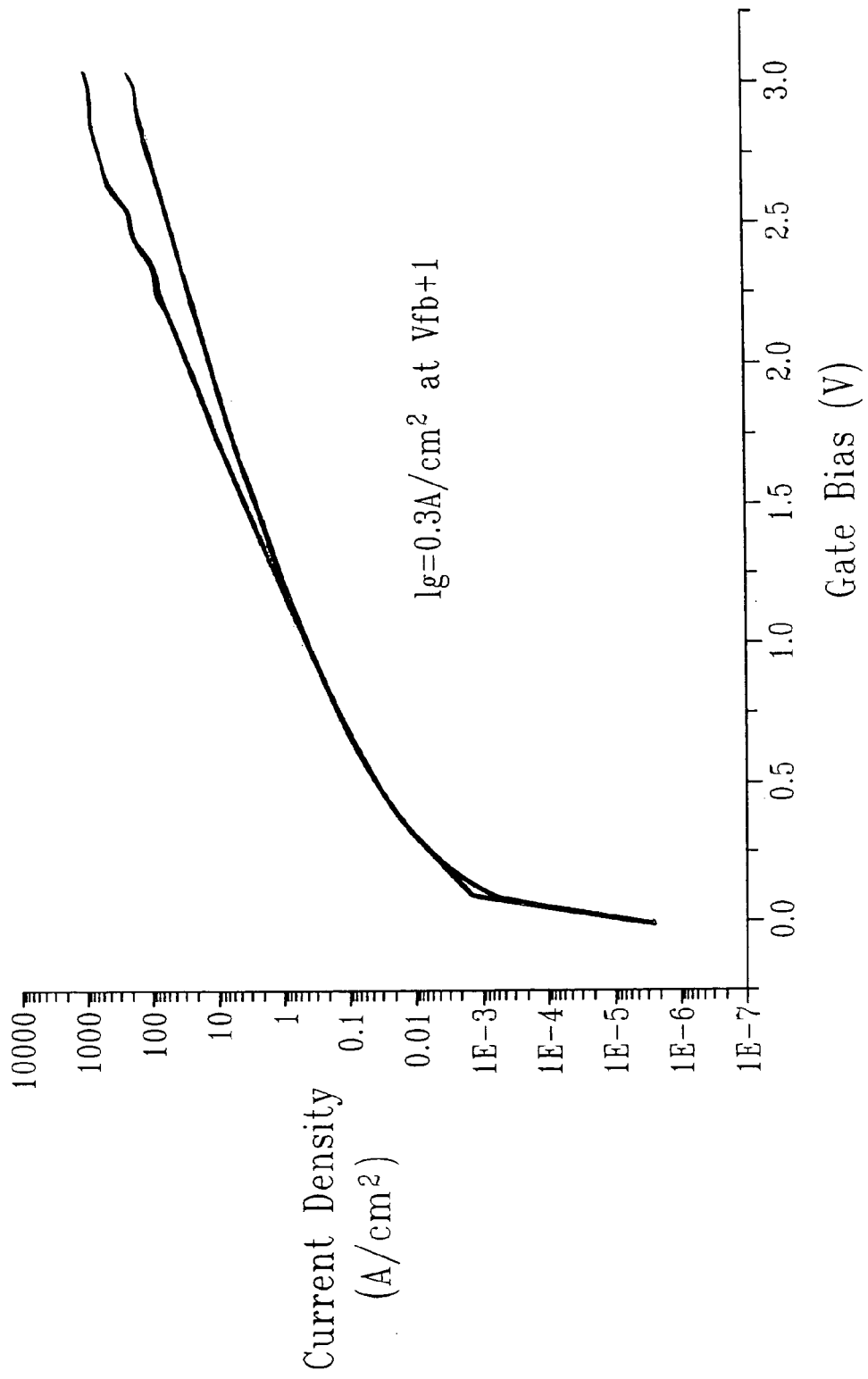
FIG. 5 is the IV curve of the inventive material stack showing that the inventive stack can be used in providing a low leakage nMOSFET device.

FIG. 4 shows a fit of the experimental CV of the Inventive material stack to the ideal CV showing that the nMOSFET including the material stack of the present invention are well behaved. FIG. 5 shows the IV curve of the inventive material stack showing that nMOSFETs including the same are well behaved devices that have low leakage.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A material stack comprising:
    a hafnium-based dielectric;
    an electrically conductive capping layer comprising at least one of Ce, Y, Sm, Er and Tb and located above said hafnium-based dielectric; and
    a Si-containing conductor located directly on said electrically conductive capping layer.

2. The material stack of claim 1 further comprising a chemox layer located beneath said Hf-based dielectric.

3. The material stack of claim 1 wherein said Hf-based dielectric comprises hafnium oxide, hafnium silicate, hafnium silicon oxynitride, a mixture of hafnium oxide and zirconium oxide or multilayers thereof.

4. The material stack of claim 3 wherein said Hf-based dielectric comprises hafnium oxide.

5. The material stack of claim 1 comprising n-doped Si as said Si-containing conductor.

6. A material stack comprising:
    a hafnium-based dielectric containing a concentration gradient of a rare earth metal-containing layer located atop of said hafnium-based dielectric;
    an electrically conductive capping layer comprising at least one of Ce, Y, Sm, Er and Tb and located above said hafnium-based dielectric; and
    a Si-containing conductor located directly on said electrically conductive capping layer.

7. The material stack of claim 6 further comprising a chemox layer located beneath said Hf-based dielectric.

8. The material stack of claim 6 wherein said Hf-based dielectric comprises hafnium oxide, hafnium silicate, hafnium silicon oxynitride, a mixture of hafnium oxide and zirconium oxide or multilayers thereof.

9. The material stack of claim 8 wherein said Hf-based dielectric comprises hafnium oxide.

10. The material stack of claim 6 comprising n-doped Si as said Si-containing conductor.

11. A material stack comprising:
a hafnium-based dielectric containing foreign atoms having a valence and electronegativity different from hafnium;
an electrically conductive capping layer comprising at least one of Ce, Y, Sm, Er and Tb and located above said hafnium-based dielectric; and
a Si-containing conductor located directly on said electrically conductive capping layer.

12. The material stack of claim 11 wherein said Hf-based dielectric comprises hafnium oxide, hafnium silicate, hafnium silicon oxynitride, a mixture of hafnium oxide and zirconium oxide or multilayers thereof.

13. The material stack of claim 12 wherein said Hf-based dielectric comprises hafnium oxide.

14. A semiconductor structure comprising:
a patterned material stack located on a surface of a semiconductor substrate, said patterned material stack comprising a hafnium-based dielectric; an electrically conductive capping layer comprising at least one of Ce, Y, Sm, Er and Tb and located above said hafnium-based dielectric, wherein said electrically conductive capping layer is a rare earth metal-containing material; and a Si-containing conductor located directly on said electrically conductive capping layer.

15. A material stack comprising:
a dielectric material having a dielectric constant of greater than about 4.0 and comprising a hafnium-based dielectric;
an electrically conductive capping layer comprising at least one of Ce, Y, Sm, Er and Tb and located above said hafnium-based dielectric; and
a Si-containing conductor located directly on said electrically conductive capping layer.

* * * * *